(12) United States Patent
Igarashi et al.

(10) Patent No.: US 6,780,676 B2
(45) Date of Patent: Aug. 24, 2004

(54) METHOD FOR FABRICATING A CIRCUIT DEVICE

(75) Inventors: Yusuke Igarashi, Gunma (JP); Noriaki Sakamoto, Gunma (JP); Yoshiyuki Kobayashi, Gunma (JP); Takeshi Nakamura, Gunma (JP)

(73) Assignee: Sanyo Electric Co., Ltd. (JP)

( * ) Notice: Subject to any disclaimer, the term of this patent is extended or adjusted under 35 U.S.C. 154(b) by 43 days.

(21) Appl. No.: 10/172,415

(22) Filed: Jun. 14, 2002

(65) Prior Publication Data

US 2002/0192857 A1 Dec. 19, 2002

(30) Foreign Application Priority Data

Jun. 19, 2001 (JP) ..................................... P.2001-185423

(51) Int. Cl.[7] .............................................. H01L 21/44
(52) U.S. Cl. ........................ 438/110; 438/118; 438/126
(58) Field of Search ................................ 438/108, 110, 438/118, 124, 126, 127

(56) References Cited

U.S. PATENT DOCUMENTS 5,777,391 A * 7/1998 Nakamura et al. .......... 438/108
5,976,912 A * 11/1999 Fukutomi et al. ........... 438/110
6,338,985 B1 * 1/2002 Greenwood ................. 438/126
6,562,660 B1 * 5/2003 Sakamoto et al. .......... 438/118

* cited by examiner

Primary Examiner—Chandra Chaudhari
(74) Attorney, Agent, or Firm—Fish & Richardson P.C.

(57) ABSTRACT

A conductive plated layer 4 is fanned after through holes 21 are formed in the insulation resin 2 by using an insulation resin sheet 1 overcoated on a single side of the conductive layer 3 with insulation resin 2. A multi-layer connection structure can be achieved by the second conductive path layer 6 which is connected, in multi layers, to the first conductive path layer 5 formed by etching the conductive plated layer 4. Further, since semiconductor elements 7 are adhered to and fixed at the overcoating resin 8 that covers the first conductive path layer 5, the first conductive path layer 5 is finely patterned, and routing thereof can be made free. Further, since the second conductive layer 4 that has been fanned to be thick can be thinly etched, the second conductive path layers 6 can be finely patterned.

18 Claims, 9 Drawing Sheets

Prior Art

Prior Art

Prior Art

METHOD FOR FABRICATING A CIRCUIT DEVICE

BACKGROUND OF THE INVENTION

1. Field of the Invention

The present invention relates to a method for fabricating a circuit device, and in particular, a method for fabricating a thin type circuit device that utilizes a conductive plated layer and conductive layer and is able to achieve multi-layer connection.

2. Description of the Prior Arts

Recently, IC packages have been actively employed in portable devices, and small-sized and high density assembly devices. Conventional IC packages and assembly concepts tend to greatly change. For example, this is described in, for example, Japanese Laid-Open Patent Publication No. 2000-133678. This pertains to a technology regarding a semiconductor apparatus in which a polyimide resin sheet being a flexible sheet is employed as one example of insulation resin sheets.

FIG. 13 through FIGS. 15A, 15B and 15C show a case where a flexible sheet 50 is employed as an interposer substrate. Also, the views illustrated upside of the respective drawings are plan views, and the views illustrated downside thereof are longitudinally sectional views taken along the lines A—A of the respective drawings.

First, copper foil patterns 51 are prepared to be adhered to each other via an adhesive resin on the flexible sheet 50 illustrated in FIG. 13. These copper foil patterns 51 have different patterns, depending upon cases where a semiconductor element to be assembled is a transistor or an IC. Generally speaking, a bonding pad 51A and an island 51B are formed. Also, an opening 52 is provided to take out an electrode from the rear side of the flexible sheet 50, from which the above-described copper foil pattern 51 is exposed.

Subsequently, the flexible sheet 50 is transferred onto a die bonder, and as shown in FIG. 14, a semiconductor element 53 is assembled or mounted. After that, the flexible sheet 50 is transferred onto a wire bonder, wherein the bonding pads 51A are electrically connected to the pads of the semiconductor elements 53 by thin metal wires 54.

Finally, as shown in FIG. 15A, sealing resin 55 is provided on the surface of the flexible sheet 50, and the surface thereof is completely sealed with the sealing resin 55. Herein, the bonding pads 51A, island 51B, semiconductor elements 53 and thin metal wires 54 are transfer-molded so as to be completely overcoated.

After that, as shown in FIG. 15B, connecting means 56 such as solder and a soldering ball is provided, wherein spherical solder 56 deposited to the bonding pad 51A is formed via the opening 52 by passing through a solder reflow furnace. Further, since semiconductor elements 53 are formed in the form of a matrix on the flexible sheet 50, these are diced to be separated from each other as shown in FIG. 15.

In addition, the sectional view of FIG. 15C shows electrodes 51A and 51D on both sides of the flexible sheet 50 as the electrodes. The flexible sheet 50 is generally supplied from a maker after both sides thereof are patterned.

Since a semiconductor apparatus that employs the above-described flexible sheet 50 does not utilize any publicly known metal frame, the semiconductor apparatus has a problem in that a multi-layer connection structure cannot be achieved while it has an advantage by which a remarkably thin package structure can be brought about, wherein path is carried out with one layer of copper foil pattern 51, which is provided substantially on the surface of the flexible sheet 50.

It is necessary to make the flexible sheet 50 sufficiently thick, for example, approx. 200 μm, in order to retain supporting strength to achieve a multi-layer connection structure. Therefore, there is a problem of retrogression with respect to thinning of the sheet.

Further, in the method for fabricating a circuit device, a flexible sheet 50 is transferred in the above-described fabrication apparatus, for example, a die bonder, wire bonder, a transfer mold apparatus, and a reflow furnace, etc., and the flexible sheet 50 is attached onto a portion called a "stage" or a "table".

However, if the thickness of the insulation resin that becomes the base of a flexible sheet 50 is made thin at approx. 50 μm, and where the thickness of a copper foil pattern 51 formed on the surface thereof is thin at 9 through 35 μm, there is a shortcoming in which the insulation resin is warped as shown in FIG. 16 to cause its transfer performance to be worsened, and mountability thereof on the above-described stage or table is also worsened. It is considered that this is because the insulation resin itself is thin in order to be warped, and warping occurs due to a difference in the thermal expansion coefficient between the copper foil pattern 51 and the insulation resin. In particular, there is another problem in that, if a hard insulation material not using any core material of glass cloth fibers is warped as shown in FIG. 16, the insulation material is easily collapsed by compression from above.

Since the portion of the opening 52 is compressed from above when being molded, a force by which the periphery of the bonding pad 51A is warped upward is brought about, the adhesion of the bonding pad 51A is worsened.

Also, the resin material that constitutes a flexible sheet 50 has less flexibility, or if a filler to increase the thermal conductivity is blended, the flexible sheet 50 is made hard. In such a case, where bonding is carried out by a wire bonder, there may be a case where the bonded portion is cracked. Also, when performing transfer molding, there is a case where the portion with which a metal die is brought into contact is cracked. This remarkably occurs if any warping shown in FIG. 16 is provided.

Although the flexible sheet 50 described above is such a type that no electrode is formed on the rear side thereof, there are cases where an electrode 51D is formed on the rear side of the flexible sheet 50 as shown in FIG. 15C. At this time, since the electrode 51D is brought into contact with the above-described fabrication apparatus or is brought into contact with the transfer plane of transfer means between the fabrication apparatuses, another problem occurs in that damage and scratches arise on the rear side of the electrode 51D, wherein the electrode is established with such damage and scratches retained, the electrode 51 itself may be cracked due to application of heat later on.

Also, if an electrode 51D is provided on the rear side of the flexible sheet 50, a problem occurs in that, when carrying out transfer molding, no facial contact with the stage can be secured. In this case, if the flexible sheet 50 is composed of a hard material as described above, the electrode 51D becomes a fulcrum and the periphery of the electrode 51D is compressed downward, wherein the flexible sheet 50 is cracked.

The present inventor proposed use of an insulation resin sheet for which the first thin conductive layer and the second thick conductive layer are adhered by insulation resin.

However, although the first conductive layer, which is thin, is finely patterned in achieving a multi-layer connection structure, there is a problem in that the second conductive layer, which is thick, is not suitable for fine patterning.

SUMMARY OF THE INVENTION

A method for fabricating a circuit device according to the invention is comprised of the steps of: preparing an insulation resin sheet having the surface of a conductive layer overcoated with insulation resin; forming through holes in the above-described insulation resin at appointed points on the above-described insulation resin sheet, and selectively exposing the rear side of the above-described conductive layer; forming a conductive plated layer in the above-described through holes and on the surface of the above-described insulation resin; forming a first conductive path layer by etching the above-described conductive plated layer to an appointed pattern; adhering and fixing semiconductor elements on the above-described first conductive path layer with the same electrically insulated therefrom; overcoating the above-described first conductive path layer and the above-described semiconductor elements with a sealing resin layer; forming a second conductive path layer by etching the above-described conductive layer to an appointed pattern after making the same thin by etching the entire surface thereof; and forming external electrodes at appointed points of the above-described second conductive path layers, whereby the above-described and other problems can be solved.

Since the flexible sheet is formed to be thick by the conductive layer, the flatness of a sheet-shaped circuit substrate can be maintained even if the insulation resin is thin.

Before the step of overcoating the first conductive path layer and semiconductor elements by a sealing resin layer, the mechanical strength of the first conductive path layer and semiconductor elements is retained by the conductive layer. After that, the mechanical strength is retained by the sealing resin layer. Therefore, it is possible to easily form the second conductive path layer by the conductive layer. As a result, the insulation resin does not need any mechanical strength, wherein it is possible to make the insulation resin thin to the thickness by which electrical insulation can be maintained.

Further, since the lower die mold and planes of a transfer molding apparatus are brought into contact with the entirety of the conductive layer, no local compression is brought about, and it is possible to prevent the insulation resin from being cracked.

Still further, since the second conductive path layer is made thin and patterned by etching the conductive layer, it becomes possible to achieve a fine pattern of the second path layer.

The method according to the invention has the following advantages.

First, warping of an insulation resin sheet can be prevented by the conductive layer until a substrate is molded by a sealing resin layer, and transfer performance thereof can be improved.

Second, since a conductive plated layer that forms the first conductive path layer is formed after the through holes, which are formed in the insulation resin, are formed by a carbonic acid gas laser, a multi-layer connection with the second conductive path layer can be simultaneously achieved, and the processes can be remarkably simplified.

Third, the conductive plated layer to form the first conductive path layer can be formed to be thin, and the first conductive path layer can be remarkably finely patterned.

Fourth, since the conductive layer can retain mechanical support of the insulation resin sheet until the sealing resin layer is formed, and the sealing resin layer can subsequently retain mechanical support of the insulation resin sheet after the second conductive path layer is formed, the mechanical strength of the insulation resin is disregarded, wherein a remarkably thin assembly method can be achieved.

Fifth, even when the insulation resin itself is hard or becomes hard by a filler being blended therein, flatness of the insulation resin sheet itself can be increased in the fabrication process since the insulation resin is supported by the conductive layer, and it is possible to prevent cracks from occurring.

Sixth, since the insulation resin sheet has the conductive layer thickly formed on its rear side, the insulation resin sheet can be utilized as a support substrate for die bonding of chips and for sealing a wire bonder and semiconductor elements. In addition, where the insulation resin material itself is soft, propagation of energy for wire bonding can be improved, and wire bondability can be further improved.

Seventh, since the second conductive layer is etched so that the sealing resin layer can be reduced to half even after molding, the second conductive path layer can be finely patterned, and it is possible to achieve a circuit device for a fine pattern along with the first conductive path layer.

DESCRIPTION OF THE PREFERRED EMBODIMENTS

A description is given of a method for fabricating a circuit device according to the invention with reference to FIG. 1 through FIG. 12.

The method for fabricating a circuit device according to the invention includes the steps of: preparing an insulation resin sheet having the surface of a conductive layer overcoated with insulation resin; forming through holes in the above-described insulation resin at appointed points on the above-described insulation resin sheet, and selectively exposing the rear side of the above-described conductive layer; forming a conductive plated layer in the above-described through holes and on the surface of the above-described insulation resin; forming a first conductive path layer by etching the above-described conductive plated layer to an appointed pattern; adhering and fixing semiconductor elements on the above-described first conductive path layer with the same electrically insulated therefrom; overcoating the above-described first conductive path layer and the above-described semiconductor elements with a sealing resin layer; forming a second conductive path layer by etching the above-described conductive layer to an appointed pattern after making the same thin by etching the entire surface thereof; and forming external electrodes at appointed points of the above-described second conductive path layers.

Figure 1:
FIG. 1 is a sectional view describing a method for fabricating a circuit device according to the invention.
Figure 2:
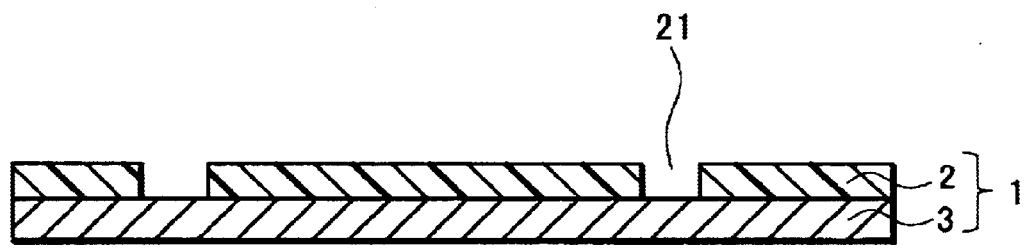
FIG. 2 is a sectional view describing a method for fabricating a circuit device according to the invention.

The first step according to the invention prepares, as shown in FIG. 1, an insulation resin sheet 1 having the surface of a conductive layer 3 overcoated with insulation resin 2.

The insulation resin sheet 1 is formed by overcoating the entire surface of the conductive layer 3 with the insulation resin 2. The material of the insulation resin 2 is an insulation material made of macromolecules such as polyimide resin or epoxy resin, etc. Also, the conductive layer 3 is, preferably, mainly composed of Cu, or may be a material of a publicly known lead frame.

In addition, the insulation resin sheet 1 is prepared by overcoating paste-like polyimide resin on a flat-film type conductive layer 3 and semi-hardening the same. Therefore, the insulation resin sheet 1 is featured in that it does not require any glass cloth fibers for reinforcement.

A characteristic point of the invention resides in thick formation of the conductive layer 3.

It is satisfactory that the conductive layer 3 is 70 through 200 μm, and emphasis is placed in that the conductive layer 3 has supporting strength.

Therefore, the thickness of the conductive layer 3 maintains the flatness of the insulation resin sheet 1, and workability of subsequent processes can be improved. In addition, it is possible to prevent the insulation resin 2 from being cracked and to prevent cracks from further occurring.

Polyimide resin, epoxy resin, etc., are preferably used as the insulation resin 2. In the case of a casting method in which paste-like resin is coated to fabricate a sheet, the layer thickness is 10 through 100 μm. Also, in a case of forming the insulation resin 2 as a sheet, a sheet that is available on the market has a minimum thickness of 25 μm. Also, a filler may be blended therein in consideration of thermal conductivity. Glass, Si oxide, aluminum oxide, Al nitride, Si carbide, boron nitride, etc., are considered as materials of the filler. As described above, the insulation resin 2 may be selected from resin having low thermal resistance, or that having super low thermal resistance, in which the above-described filler is blended, or polyimide resin. These resins may be selectively used, depending upon the characteristics of a circuit device to be formed.

The second step according to the invention forms through holes 21 in the insulation resin 2 at appointed points of the insulation resin sheet 1 and selectively exposes the rear side of the conductive layer 3.

Only the portions where the through holes 21 are formed in the insulation resin 2 are exposed, and the entire surface is overcoated with photo-resist. And, insulation resin 2 immediately below the through holes 21 is removed by laser, using the photo-resist as a mask, wherein the rear side of the conductive layer 3 is exposed to the bottom of the through holes 21. A carbonic acid gas laser is preferable as the laser. Where residue remains on the bottom of the opening portion after the insulation resin 2 is evaporated by the laser, wet etching is carried out by using permagnaic acid soda or persulfuric acid ammonium, etc., in order to remove the residue. Although the opening diameter of the through holes 21 may vary on the basis of the degree of resolution of photolithography, it is herein 50 through 100 μm.

Figure 3:
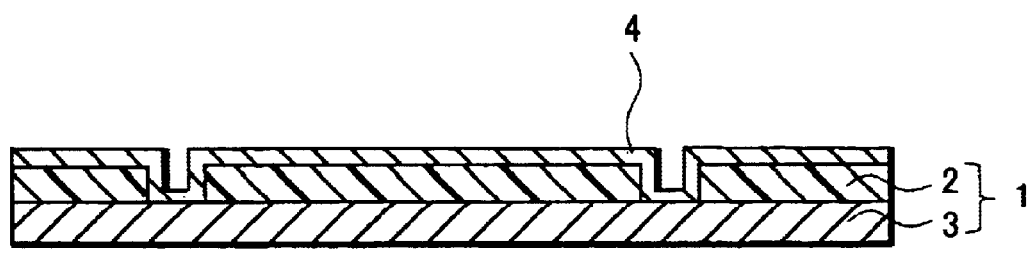
FIG. 3 is a sectional view describing a method for fabricating a circuit device according to the invention.

The third step according to the invention forms, as shown in FIG. 3, a conductive plated layer 4 in the through holes 21 and on the surface of the insulation resin 2.

A conductive plated layer 4 is formed on the entire surface of the insulation resin 2 including the through holes 21 without using any mask. The conductive plated layer 4 is formed by both non-electrolytic plating and electrolytic plating. Herein, Cu of approx. 2 μm is formed on the entire surface of the insulation resin 2 including at least the through holes 21 by non-electrolytic plating. Thereby, since the conductive plated layer 4 and the conductive layer 3 are electrically made continuous, electrolytic plating is carried out again by using the conductive layer 3 as an electrode, wherein Cu of approx. 20 μm is plated. Herein, the through holes 21 may be filled by a conductive Cu-plated layer 4. Also, although Cu is employed herein for the conductive plated layer 4, Au, Ag, Pd, etc., may be employed. Also, partial plating may be acceptable by using a mask.

Figure 4:
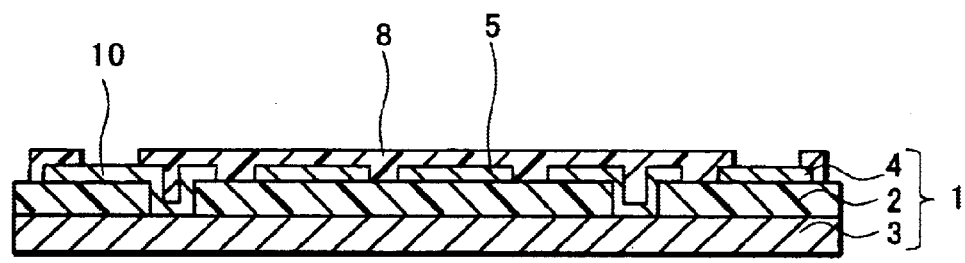
FIG. 4 is a sectional view describing a method for fabricating a circuit device according to the invention.
Figure 5:
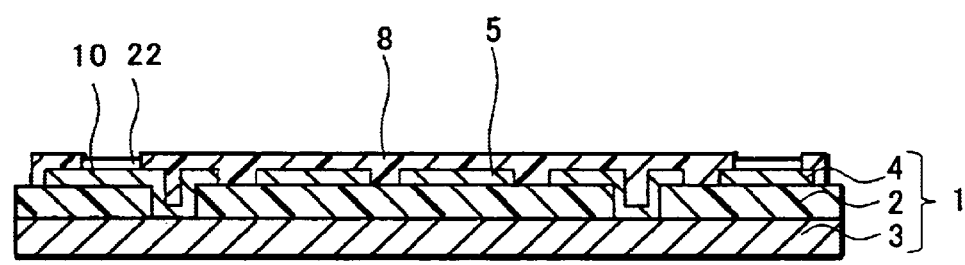
FIG. 5 is a sectional view describing a method for fabricating a circuit device according to the invention.

The fourth step according to the invention forms the first conductive path layer 5 by etching the conductive plated layer 4 to an appointed pattern as shown in FIG. 4 and FIG. 5.

The conductive plated layer 4 is overcoated with photo-resist of an appointed pattern, and the bonding pads 10 and the first conductive path layer 5 extending from these bonding pads 10 to the center of a substrate are formed by chemical etching. Since the conductive plated layer 4 is mainly composed of Cu, the etching solution of ferric chloride or cupric chloride may be used for the chemical etching.

Since the conductive plated layer 4 is formed to be 5 through 20 μm or so, the first conductive path layer 5 may be formed to be a fine pattern which is smaller than 20 μm.

Continuously, as shown in FIG. 5, the bonding pads 10 of the first conductive path layer 5 are exposed, and other portions are overcoated with overcoating resin 8. The overcoating resin 8 is such that epoxy resin, etc., is dissolved with a solvent and is adhered by a screen printing method, and is thermally hardened.

A plated layer 22 of Au, Ag, etc., is formed on the bonding pads 10 in consideration of the bonding ability. The plated layer 22 is non-electrolytically plated selectively on the bonding pads 10 by using the overcoating resin 8 as a mask, or is adhered by electrolytical plating, using the conductive layer 3 as an electrode.

Figure 6:
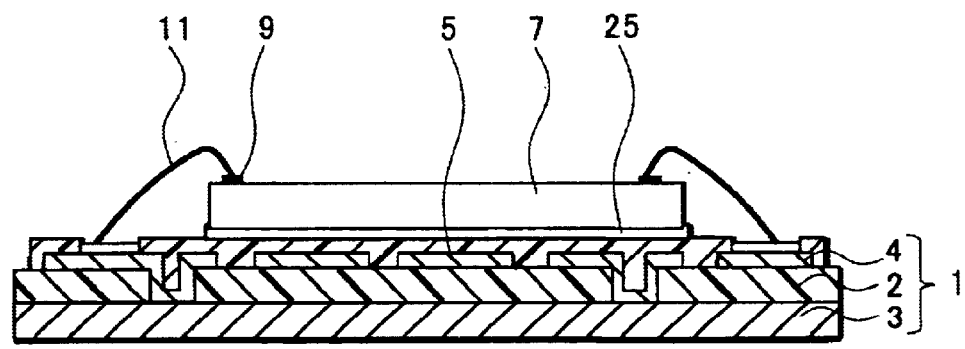
FIG. 6 is a sectional view describing a method for fabricating a circuit device according to the invention.

The fifth step according to the invention adheres and fixes a semiconductor element 7 on the first conductive path layer 5 after being electrically insulated therefrom as shown in FIG. 6.

The semiconductor element 7 is die-bonded on the overcoating resin 8 by insulation adhesion resin 25 as it is a bare chip. Since the semiconductor element 7 is electrically insulated from the first conductive path layer 5 immediately therebelow by the overcoating resin 8, the first conductive path layer 5 can be freely routed below the semiconductor element 7, thereby achieving a multi-layered connection structure.

Also, respective electrode pads 9 of the semiconductor element 7 are connected to the bonding pads 10, which are parts of the first conductive path layer 5 secured at the periphery, by bonding wires 11. The semiconductor elements 7 may be assembled with the faces down. (See FIG. 11.) In this case, soldering balls and bumps are provided on the surface of the respective electrodes 9 of the semiconductor elements 7, and electrodes similar to the bonding pads 10 are provided at portions corresponding to the positions of the soldering balls on the surface of the insulation resin sheet 1.

A description is given of the advantages of using the insulation resin sheet 1 when bonding wires. Generally, when bonding Au wires, heating is carried out around 200 through 300° C. At this time, the insulation resin sheet 1 is warped if the conductive layer 3 is thin. If the insulation resin sheet 1 is compressed via the bonding head in this state, there is a possibility for the insulation resin sheet 1 to be cracked. This remarkably occurs since, if a filler is blended in the insulation resin 2, the material itself becomes hard and flexibility is lost. Also, since resin is softer than metals, energy of compression and ultrasonic waves may be dispersed in the bonding of Au and Al. However, if the insulation resin 2 is made thin and the conductive layer 3 is formed to be thick, these problems can be solved.

Figure 7:
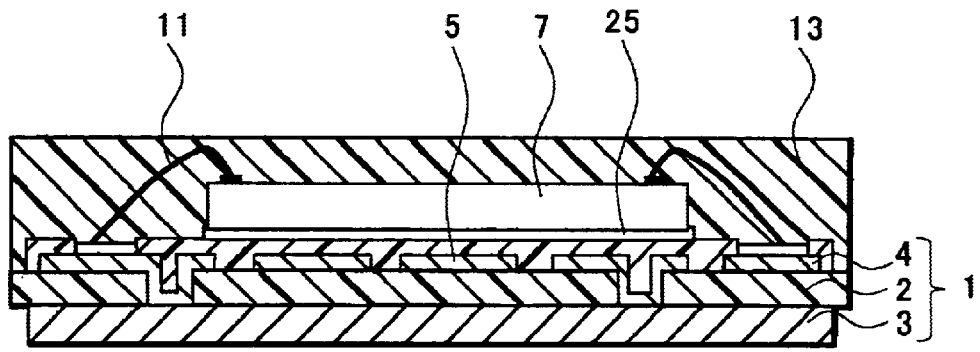
FIG. 7 is a sectional view describing a method for fabricating a circuit device according to the invention.

The sixth step according to the invention overcoats the first conductive path layer 5 and the semiconductor element 7 with a sealing resin layer 13 as shown in FIG. 7.

The insulation resin sheet 1 is set in a molding apparatus and is used for resin molding. Transfer molding, injection molding, coating, dipping, etc., may be possible as the molding method. However, in consideration of mass production, the transfer molding and injection molding are favorable.

Although, in this step, it is necessary that the insulation resin sheet 1 is flatly brought into contact with the lower metal die of a mold cavity, the conductive layer 3, which is thick, functions like this. In addition, until contraction of the sealing resin layer 13 is completely finished after the insulation resin sheet 1 is taken out from the mold cavity, the flatness of a package can be maintained by the conductive layer 3.

That is, the role of the mechanical support of the insulation resin sheet 1 is retained by the conductive layer 3.

Figure 8:
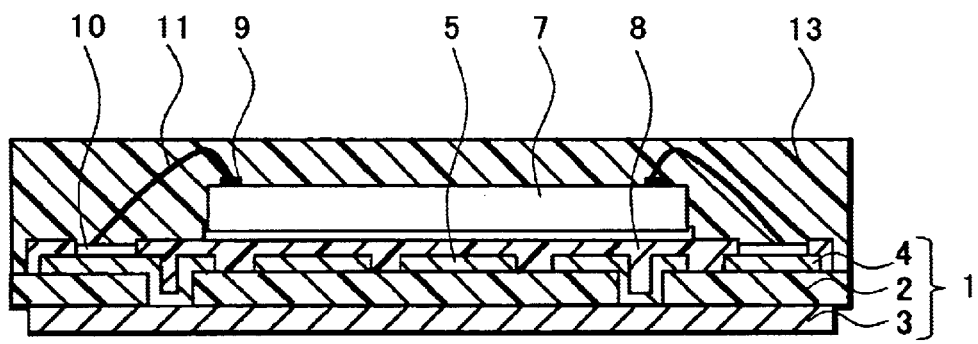
FIG. 8 is a sectional view describing a method for fabricating a circuit device according to the invention.
Figure 9:
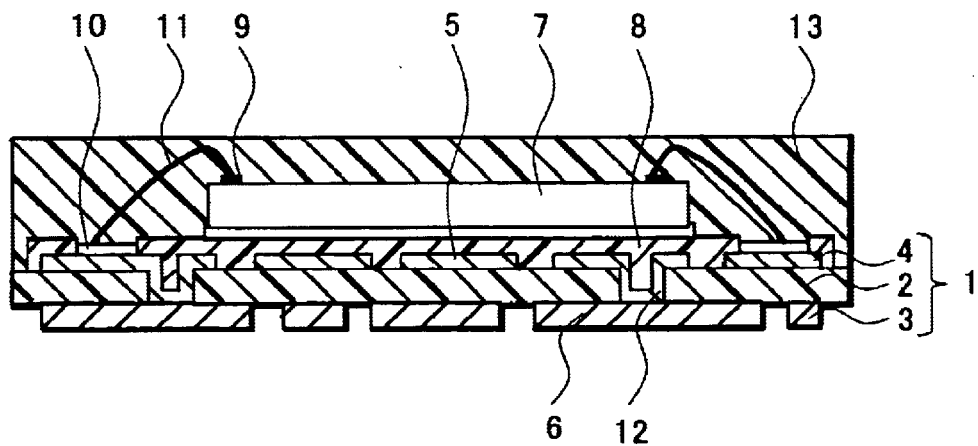
FIG. 9 is a sectional view describing a method for fabricating a circuit device according to the invention.

The seventh step according to the invention forms, as shown in FIG. 8 and FIG. 9, the second conductive path layer 6 by etching the conductive layer 3 to an appointed pattern after making the same thin by etching the entire surface of the conductive layer 3.

A shown in FIG. 8, the entire surface of the conductive layer 4 is etched to become thin without any mask. The etching may be chemical etching using ferric chloride or cupric chloride. The second conductive layer 4 is uniformly made thin to 35 $\mu$m that is almost half the initial thickness of 70 through 200 $\mu$m. At this time, it is possible to eliminate damage and scratches generated on the second conductive layer 4 in the preceding processes.

Continuously, as shown in FIG. 9, the conductive layer 3 is overcoated with photo-resist of an appointed pattern and the second conductive path layers 6 are formed by chemical etching. The second conductive path layers 6 are individually electrically connected to the first conductive path layers 5 via the through holes 21, thereby achieving a multi-layer connection structure. Also, if necessary, the second conductive layers 6 to cross the first conductive path layers 5 may be formed at blank portions.

Figure 10:
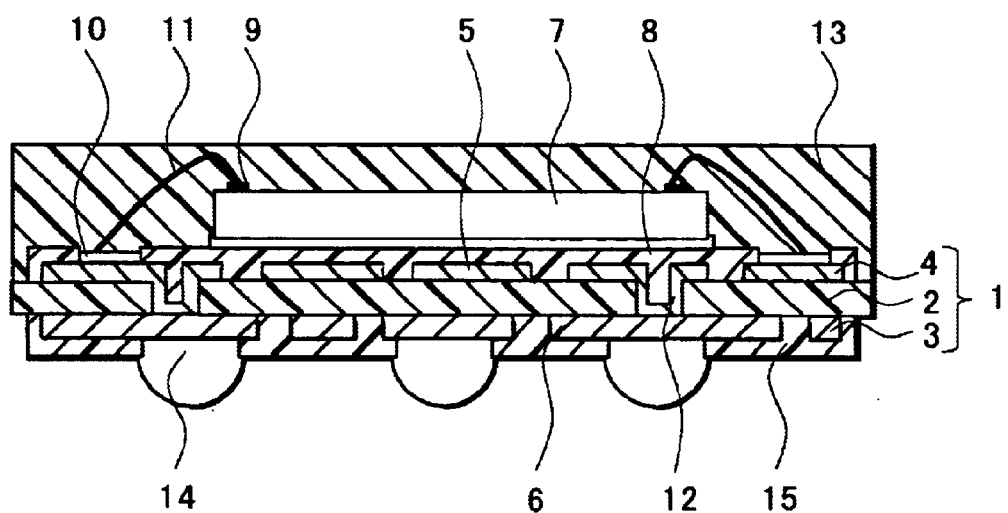
FIG. 10 is a sectional view describing a method for fabricating a circuit device according to the invention.

The eighth step according to the invention forms, as shown in FIG. 10, external electrodes 14 at appointed points of the second conductive path layer 6.

The second conductive path layer 6 has portions, at which the external electrodes 14 are formed, exposed, and almost all the portions of the second conductive path layer 6 are overcoated with an overcoating resin layer 15 by screen-printing of epoxy resin, etc., which is dissolved by a solvent. Next, external electrodes 14 are simultaneously formed at the exposed portions by reflowing of solder or screen printing of solder cream.

Finally, since a number of circuit devices are formed on the insulation resin sheet 1 in the form of matrices, the sealing resin layer 13 and insulation resin sheet 1 are diced and are separated for individual circuit devices.

Figure 11:
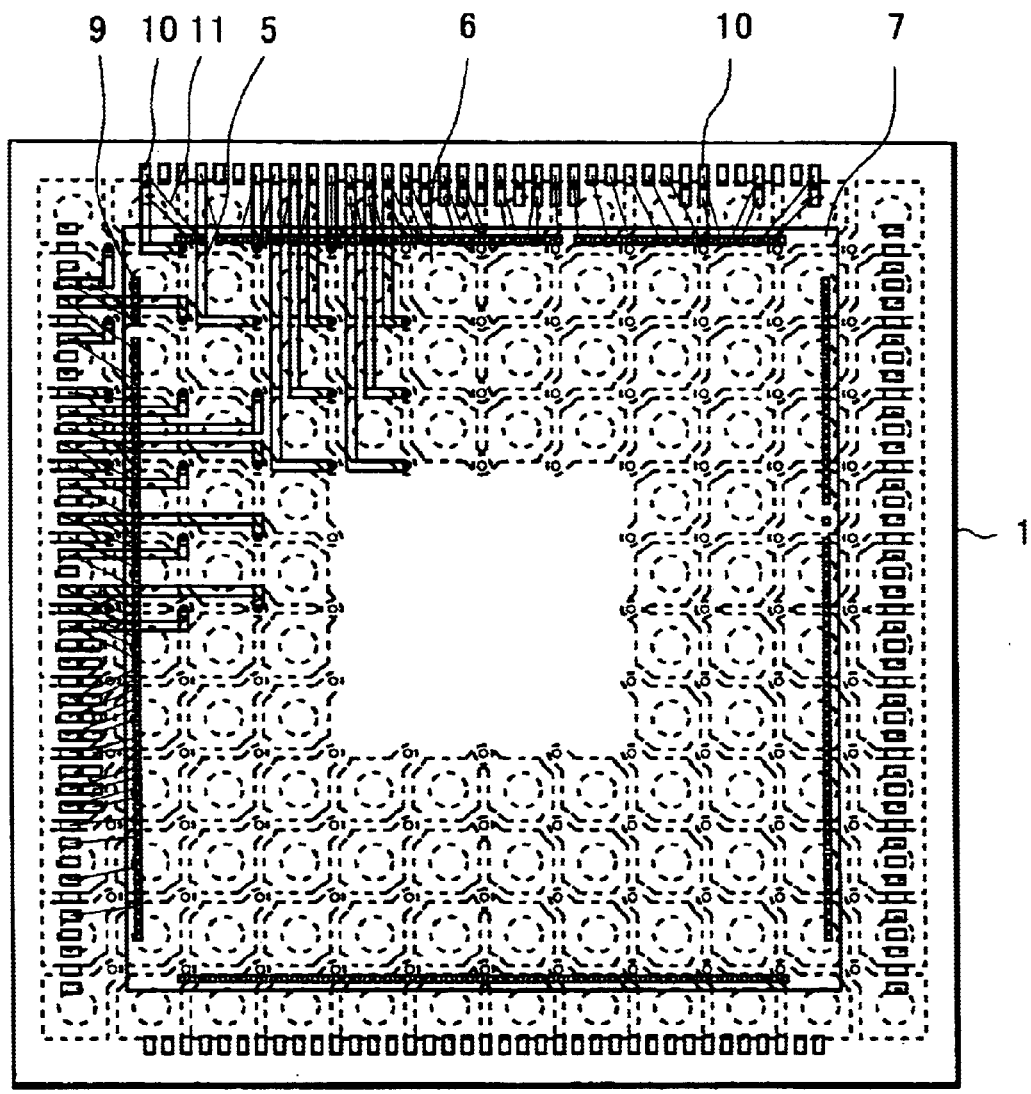
FIG. 11 is a plan view describing a circuit device fabricated on the basis of the invention.

With reference to FIG. 11, a description is given of a circuit device according to the embodied method of the invention. First, a pattern shown with solid lines is the first conductive path layer 5, and a pattern shown with dashed lines is the second conductive path layer 6. Bonding pads 10 are provided at the periphery of the semiconductor element 7 so as to surround the same on the first conductive path layer 5, and some of the pads are provided in two stages so as to correspond to a semiconductor element 7 having multiple pads. The bonding pads 10 are connected to electrode pads 9, to which the semiconductor elements 7 correspond, by bonding wires 11. A number of first conductive path layers 5 of a fine pattern extend below the semiconductor element 7 from the bonding pads 10, and are connected to the second conductive path layers 6 by through holes 21 shown by a black circle.

In such a structure, even a semiconductor element having 200 or more pads is caused to extend to an appointed second conductive path layer 6, by using a fine pattern of the first conductive path layer 5, by means of a multi-layer connection structure, wherein connections from the external electrodes 14 secured on the second conductive path layers 6 to a peripheral circuit can be carried out.

Figure 12:
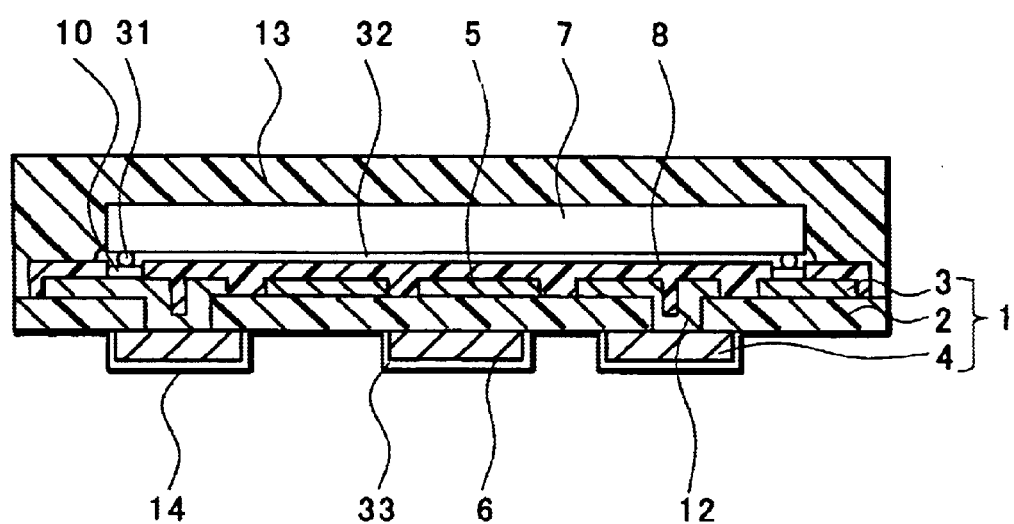
FIG. 12 is a sectional view describing a method for fabricating a circuit device according to the invention.
Figure 13:
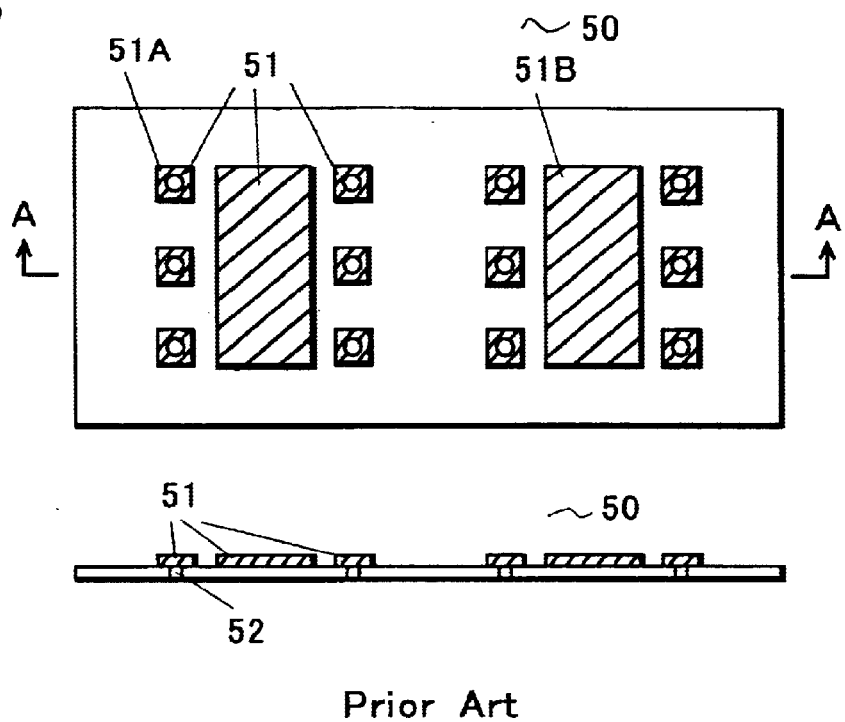
FIG. 13 is a view describing a method for fabricating a semiconductor according to prior arts.
Figure 14:
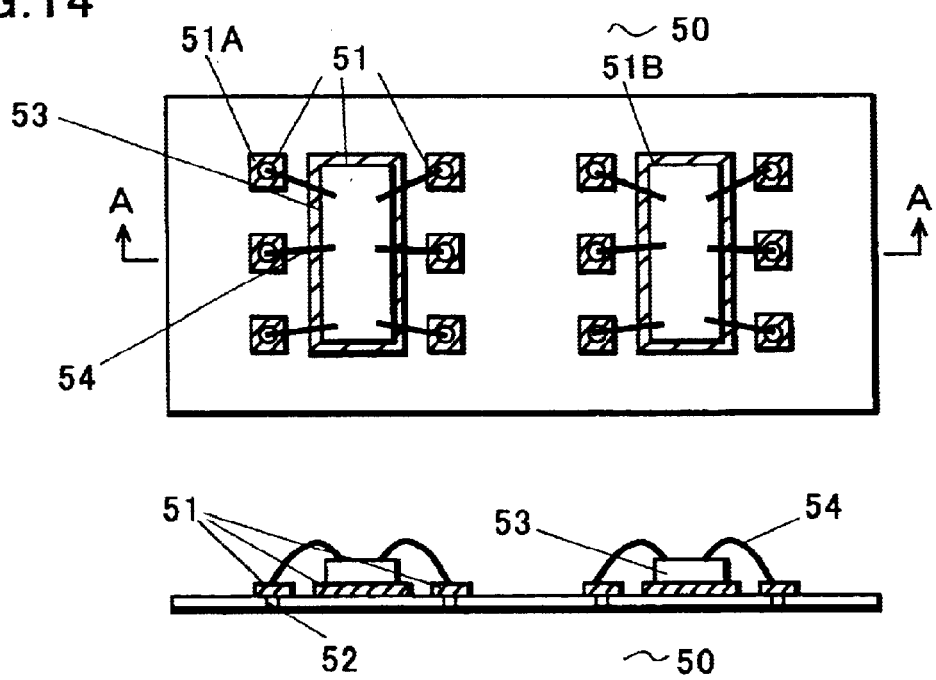
FIG. 14 is a view describing a method for fabricating a semiconductor according to prior arts.
Figure 15A:
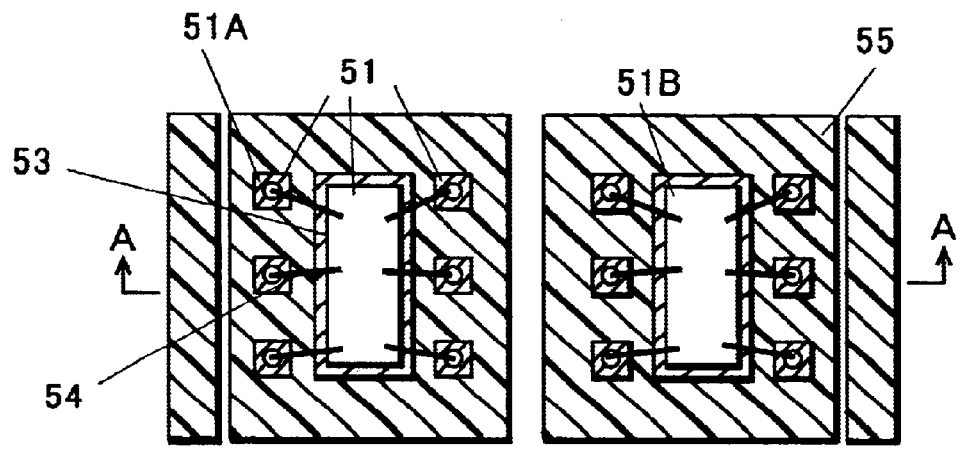
FIGS. 15A, 15B and 15C is a view describing a method for fabricating a semiconductor according to prior arts.
Figure 15B:
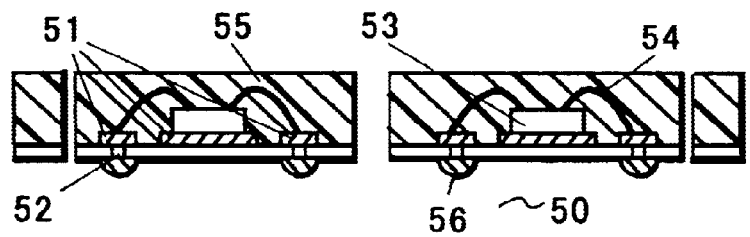
Figure 15C:
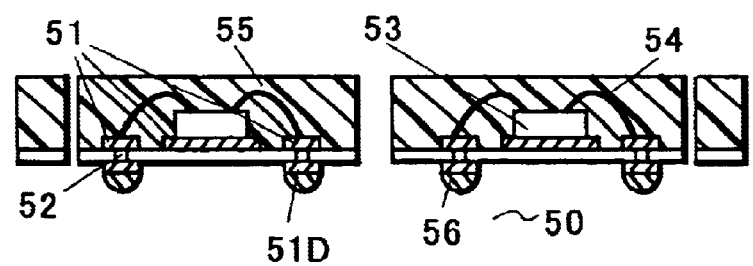
Figure 16:
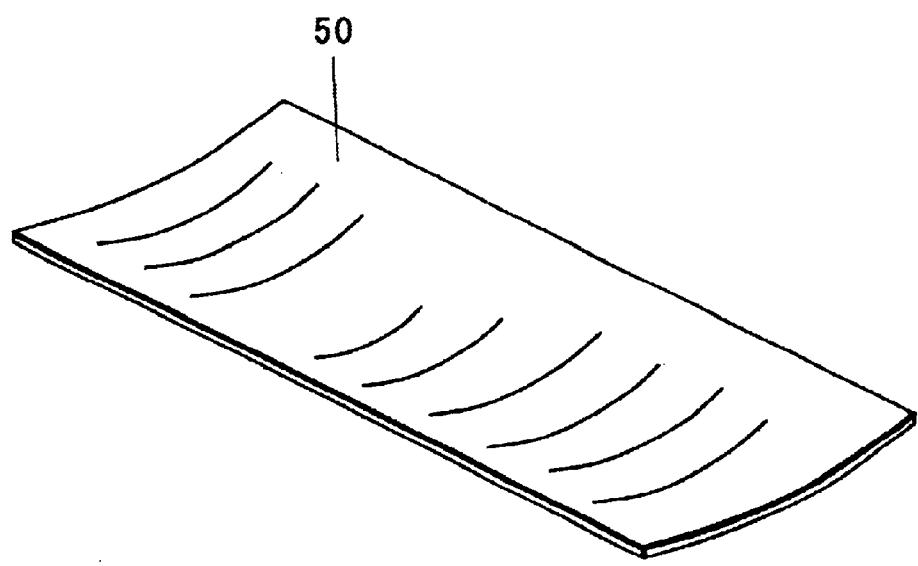
FIG. 16 is a view describing a prior art flexible sheet.

FIG. 12 shows a structure in which a semiconductor element 7 is assembled with its face down. Parts which are similar to those in FIG. 10 are given the same reference numbers. A bump electrode 31 is provided at the semiconductor element 7, and the bump electrode 31 is connected to a bonding pad 10. Under-filling resin 32 is filled in the gap between the overcoat resin 8 and the semiconductor element 7. Bonding wires can be removed in this structure, and the thickness of the sealing resin layer 13 can be made thinner. Also, the external electrodes 14 can be achieved by a bump electrode in which the conductive layer 3 is etched, and the surface thereof is overcoated with a gold- or palladium-plated layer 33.

What is claimed is:

1. A method for fabricating a circuit device, comprising:
preparing an insulation resin sheet having the surface of a conductive layer overcoated with insulation resin;
forming through holes in said insulation resin at appointed points on said insulation resin sheet, and selectively exposing the rear side of said conductive layer;
forming a conductive plated layer in said through holes and on the surface of said insulation resin;
forming a first conductive path layer by etching said conductive plated layer to an appointed pattern;

adhering and fixing semiconductor elements on said first conductive path layer with the same electrically insulated therefrom;

overcoating said first conductive path layer and said semiconductor elements with a sealing resin layer;

forming a second conductive path layer by etching said conductive layer to an appointed pattern after making the same thin by etching the entire surface thereof; and forming external electrodes at appointed points of said second conductive path layers.

2. The method for fabricating a circuit device according to claim 1, wherein said conductive layer and said conductive plated layer are formed of copper.

3. The method for fabricating a circuit device according to claim 1, wherein said conductive plated layer is formed to be thin, and said first conductive path layer is finely patterned.

4. The method for fabricating a circuit device according to claim 1, wherein said conductive layer is formed to be thick, and said conductive layer is used for mechanical support until the step for overcoating with said sealing resin layer is completed.

5. The method for fabricating a circuit device according to claim 1, wherein said first conductive layer is mechanically supported by said sealing resin layer after the step of overcoating the same with said sealing resin layer.

6. The method for fabricating a circuit device according to claim 1, wherein said through holes are prepared by laser etching of said insulation resin.

7. The method for fabricating a circuit device according to claim 6, wherein said laser etching utilizes a carbonic acid gas laser.

8. The method for fabricating a circuit device according to claim 1, wherein said conductive plated layer is formed in said through holes and on the surface of said insulation resin by non-electrolytic plating and electrolytic plating of a conductive metal.

9. The method for fabricating a circuit device according to claim 1, wherein said first conductive path layer is overcoated with overcoating resin with appointed portions thereof not overcoated after said first conductive path layer is formed.

10. The method for fabricating a circuit device according to claim 9, wherein a layer plated by gold or silver is formed at portions exposed from said overcoating resin of said first conductive path layer.

11. The method for fabricating a circuit device according to claim 9, wherein said semiconductor elements are adhered to and fixed on said overcoating resin.

12. The method for fabricating a circuit device according to claim 10, wherein electrodes of said semiconductor elements and said gold- or silver-plated layer are connected to each other by bonding wires.

13. The method for fabricating a circuit device according to claim 1, wherein said sealing resin layer is formed by a transfer mold.

14. The method for fabricating a circuit device according to claim 1, wherein said conductive layer is made thin by uniformly etching the entire surface thereof without any mask.

15. The method for fabricating a circuit device according to claim 1, wherein almost all of the said second conductive path layer is overcoated with overcoating resin.

16. The method for fabricating a circuit device according to claim 1, wherein said external electrodes have solder adhered thereto by screen printing of solder and are formed by being heated and dissolved.

17. The method for fabricating a circuit device according to claim 1, wherein said external electrodes are formed by reflowing of solder.

18. The method for fabricating a circuit device according to claim 1, wherein said external electrodes are formed with the surface thereof plated with gold or palladium by etching said conductive layer to an appointed pattern.

* * * * *